US 9,988,301 B2

(12) United States Patent
Takao et al.

(10) Patent No.: US 9,988,301 B2
(45) Date of Patent: Jun. 5, 2018

(54) VANADIUM-BASED GLASS MATERIAL FOR LOCAL HEAT SEALING, FLAT DISPLAY USING THE SAME, AND METHOD FOR MANUFACTURING THE DISPLAY (71) Applicant: YAMATO ELECTRONIC CO., LTD., Kagoshima (JP)

(72) Inventors: Yoshinari Takao, Kagoshima (JP); Yoshihiro Kohara, Kagoshima (JP)

(73) Assignee: YEJ GLASS Co., Ltd. (JP)

( * ) Notice: Subject to any disclaimer, the term of this patent is extended or adjusted under 35 U.S.C. 154(b) by 91 days.

(21) Appl. No.: 14/871,629

(22) Filed: Sep. 30, 2015

(65) Prior Publication Data
US 2016/0096768 A1 Apr. 7, 2016

Related U.S. Application Data (63) Continuation of application No. PCT/JP2014/076466, filed on Oct. 2, 2014.

(51) Int. Cl.
C03C 8/14 (2006.01)
C03B 23/24 (2006.01)
(Continued)

(52) U.S. Cl.
CPC .............. C03C 8/14 (2013.01); C03B 23/245 (2013.01); C03C 3/062 (2013.01); C03C 3/125 (2013.01);
(Continued)

(58) Field of Classification Search
CPC .... C03C 8/02; C03C 8/04; C03C 8/14; C03C 4/0071; C03C 8/24; H01L 51/5246; H01L 23/29; H01L 27/3244; H01L 23/291
See application file for complete search history.

(56) References Cited

U.S. PATENT DOCUMENTS

2005/0233885 A1* 10/2005 Yoshida .................. C03C 3/122
501/15
2009/0155555 A1* 6/2009 Botelho .................... C03C 8/14
428/210
(Continued)

FOREIGN PATENT DOCUMENTS

JP H06263478 A 9/1994
JP 2006137635 A 6/2006
JP 2006524419 A 10/2006
(Continued)

OTHER PUBLICATIONS

Notice of Allowance Application No. JP 2015-538191 dated Sep. 9, 2016 6 pages.

Primary Examiner — Samir Shah
Assistant Examiner — Jasper Saberi
(74) Attorney, Agent, or Firm — St. Onge Steward Johnston & Reens LLC (57) ABSTRACT A vanadium-based glass material for local heat sealing has a glass composition containing, in terms of mol %, 30.0 to 60.0% $V_2O_5$, 20.1 to 30.0% ZnO, 10.0 to 25.0% $TeO_2$, 1.0 to 5.0% $Al_2O_3$, 0.5 to 5.0% $Nb_2O_5$, 0 to 10.0% BaO, 0 to 5.0% $Fe_2O_3$, 0 to 5.0% $MnO_2$, 0 to 5.0% CuO, 0 to 5.0% $SiO_2$, and 0 to 8.0% CaO, and substantially not containing Pb and P.

6 Claims, 1 Drawing Sheet (51) Int. Cl.
    *C03C 8/04*         (2006.01)
    *H01L 27/32*       (2006.01)
    *C03C 3/062*      (2006.01)
    *C03C 3/12*        (2006.01)
    *C03C 8/24*        (2006.01)
    *H01L 23/29*      (2006.01)
    *H01L 51/52*      (2006.01)

(52) U.S. Cl.
    CPC .................. *C03C 8/04* (2013.01); *C03C 8/24* (2013.01); *H01L 27/3244* (2013.01); *C03C 3/122* (2013.01); *C03C 2207/00* (2013.01); *H01L 23/29* (2013.01); *H01L 23/291* (2013.01); *H01L 51/5246* (2013.01); *H01L 2251/305* (2013.01)

(56) References Cited

U.S. PATENT DOCUMENTS

2012/0321902 A1* 12/2012 Kohara ..................... C03C 8/04
                                                          428/428
2015/0187510 A1* 7/2015 Naito ................... H01L 23/295
                                                         428/76

FOREIGN PATENT DOCUMENTS

| JP | 2006342044 | A | 12/2006 |
| JP | 2007182347 | A | 7/2007 |
| JP | 2012106891 | A | 6/2012 |
| JP | 2013032044 | A | 2/2013 |
| JP | 2014509295 | A | 4/2014 |
| WO | 2011108115 | A1 | 9/2011 |
| WO | 2012115796 | A1 | 8/2012 |

\* cited by examiner

VANADIUM-BASED GLASS MATERIAL FOR LOCAL HEAT SEALING, FLAT DISPLAY USING THE SAME, AND METHOD FOR MANUFACTURING THE DISPLAY

FIELD OF THE INVENTION

The present invention relates to a vanadium-based glass material used for sealing joints of glass members in an organic electroluminescence (EL) display or a liquid crystal display by a local heating method like laser heating, and relates to a flat display using the vanadium-based glass material and a method for manufacturing the display.

BACKGROUND OF THE INVENTION

Figure 1:
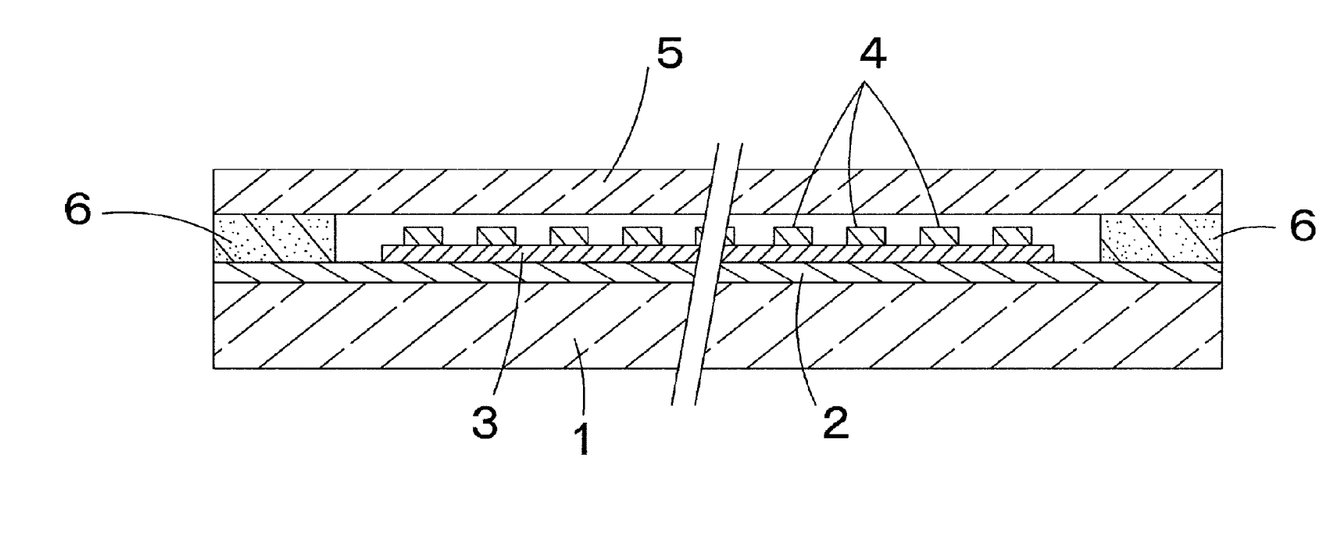
FIG. 1 is a longitudinal sectional side view showing a schematic configuration example of an organic EL display to which the present invention is applied.

A self-luminous organic EL display employing an organic light emitter such as diamines has been the focus of attention as a flat display in recent years. As shown in FIG. 1 for example, this organic EL display has a structure that an EL element substrate 1 made of glass has one of the surfaces (an inner surface) formed with, sequentially from the bottom layer side, a lower electrode 2 in a parallel striped pattern, an organic light-emitting layer 3, and an upper electrode 4 in a parallel striped pattern extending along an orthogonal direction to the lower electrode 2, and that between peripheral portions of the EL element substrate 1 and a sealing glass plate 5 arranged opposed thereto are sealed by a sealing layer 6.

This kind of organic EL display has many advantages; the display has high luminance, high contrast, and excellent display recognizability, can be formed extremely thin in thickness, is applicable also to an ultra-thin display having a total thickness of 1 mm or thinner for use in small devices such as a cell-phone (a cellular mobile telephone) and a digital camera, can be constructed of solid materials in its entirety, and is driven with direct current, so that a driving circuit thereof is simplified. On the other hand, there is a drawback that luminescence characteristics of the organic EL element are significantly deteriorated by contact with moisture. Therefore, the organic EL element needs to be strictly cut off from the outside air.

At present, a sealing method with use of a glass frit and a laser is considered to be the leading candidate as a sealing means for the organic EL display. That is, the glass frit is such that a powder mixture whose components are mainly metal oxides is heated, melted, vitrified, and then finely pulverized. This powder is brought into a paste form and coated on a sealed portion and melted again by heating to form a sealing glass layer. While a sealing temperature of a general glass frit is 400° C. or more, the organic EL display may have a problem in sealing by in-furnace heating that an organic EL element is damaged or thermally degraded under the influence of high temperature. Thus, a method is suitable that a laser beam is irradiated on panel peripheral portions between which the glass frit intervenes, and only sealed portions are locally heated to melt the glass frit.

In this laser sealing, a glass frit with high absorbability of a laser beam is preferably used in achieving good sealing quality. In terms of this, a vanadium-based glass frit having a color tone of dark brown or seal brown is seen as promising. A variety of glass compositions have been proposed as the vanadium-based glass frit heretofore. For example, Patent Document 1 discloses a glass frit which is of a $V_2O_5$—$P_2O_5$—$Bi_2O_3$ system and has an optional component of oxides of Zn, Te, alkali metal, and alkaline earth metal. Patent Document 2 discloses a glass frit which is of a $V_2O_5$—$P_2O_5$ system and has an optional component of oxides of Sb, Fe, K, Ti, Al, B, W and Bi. Patent Document 3 discloses a glass frit which is of a $V_2O_5$—$TeO_2$—$BaO$—$WO_3$ system and a $V_2O_5$—$TeO_2$—$BaO$—$ZnO$—$Sb_2O_3$ system and has an optional component of oxides of P, Sr, Ge, La, Cr, Nb, Y, Mg, Ce, Er, etc. Patent Document 4 discloses a glass frit which is of a $V_2O_5$—$TeO_2$—$P_2O_5$ system and has an optional component of ZnO and BaO. Patent Document 5 discloses a glass frit which is of a $V_2O_5$—$TeO_2$—$Ag_2O$ system and has an optional component of oxides of P, Ba, Zn, K, W, Fe, Mn, Sb, etc. Further, the present applicant has previously proposed, as Patent Document 6, a lead-free glass material for organic-EL sealing, which is of a $V_2O_5$—$ZnO$—$BaO$—$TeO_2$ system and has an optional component of oxides of Nb, Al, Si, Mg, Sb, Cu, and Sn and also contains $Nb_2O_5+Al_2O_3$ at a specific range.

The vanadium-based glass frits disclosed in Patent Documents 1 to 5 have a composition containing $P_2O_5$ as an essential component or a particularly preferable optional component, and accordingly have a drawback that water resistance of sealed glass portions having been melted again is insufficient and moisture enters inside with time to bring about a reduction in luminescence characteristics of the organic EL element. Further, a glass frit preferably has a lower softening temperature in order to reduce the thermal adverse effects on the organic EL element even in the case of the laser sealing, preferably has a thermal expansion coefficient closer to that of a glass substrate which is an object to be sealed, in order to ensure the sealing and enhance the sealing strength, and is preferably highly stable and less likely to undergo a crystal deposition during melting in order to loosen conditions in performing the sealing continuously and suppress occurrence of an error. Hence, the conventional glass frits cannot exhibit satisfactory performance in terms of low-temperature softening properties, thermal expansion coefficients, stability, etc.

PATENT DOCUMENTS

Patent Document 1: Japanese Published Unexamined Patent Application No. 2006-342044
Patent Document 2: Japanese Translation of International Application (Kohyo) No. 2006-524419
Patent Document 3: Japanese Translation of International Application (Kohyo) No. 2007-182347
Patent Document 4: Japanese Published Unexamined Patent Application No. 2012-106891
Patent Document 5: Japanese Published Unexamined Patent Application No. 2013-032044
Patent Document 6: Japanese Published Unexamined Patent Application No. WO2011/108115

SUMMARY OF THE INVENTION

The lead-free glass material described in Patent Document 6 (hereinafter, referred to as an earlier filed patent application) has a composition containing no $P_2O_5$, is excellent in water resistance, has the low softening temperature and thermal expansion coefficient and high stability at the time of melting, and can suppress the thermal adverse effects on the organic EL element by the laser sealing and achieve high yields, high sealability, and large sealing strength. Thus, this lead-free glass material has high suitability for the sealing of the organic EL display as described above, but has room for further improvement in terms of laser sealability, water resistance, thermal expansion coefficient, and material costs.

In view of the foregoing circumstances, the present invention aims at providing a vanadium-based glass material used for sealing joints of glass members in a flat display such as an organic EL display or a liquid crystal display by a local heating method like laser heating, the glass material being far superior in laser sealability and water resistance and having a lower thermal expansion coefficient as compared to the lead-free glass material according to the proposal of the present applicant, and being capable of reducing the manufacturing costs greatly. Further, another object of the present invention is to provide a flat display of high quality and with high long-term reliability through the use of the above vanadium-based glass material for local heat sealing and a method for manufacturing the display efficiently and steadily.

In order to achieve the above objects, a vanadium-based glass material for local heat sealing according to the first aspect of the present invention has a glass composition containing, in terms of mol %, 30.0 to 60.0% $V_2O_5$, 20.1 to 30.0% ZnO, 10.0 to 25.0% $TeO_2$, 1.0 to 5.0% $Al_2O_3$, 0.5 to 5.0% $Nb_2O_5$, 0 to 10.0% BaO, 0 to 5.0% $Fe_2O_3$, 0 to 5.0% $MnO_2$, 0 to 5.0% CuO, 0 to 5.0% $SiO_2$, and 0 to 8.0% CaO and substantially not containing Pb and P.

The second aspect of the present invention is configured such that $Fe_2O_3$ in the glass composition is 1.0 to 5.0 mol % in the vanadium-based glass material for local heat sealing as set forth in the first aspect.

The third aspect of the present invention is configured such that $MnO_2$ in the glass composition is 1.0 to 5.0 mol % in the vanadium-based glass material for local heat sealing as set forth in the first aspect.

The fourth aspect of the present invention is configured such that CuO in the glass composition is 1.0 to 5.0 mol % in the vanadium-based glass material for local heat sealing as set forth in the first aspect.

The fifth aspect of the present invention is configured such that a glass powder of the above glass composition is mixed with a filler in a range of ratio by weight of the glass powder to the filler of 50:50 to 99:1 in the vanadium-based glass material for local heat sealing as set forth in any one of the first to fourth aspects.

A flat display according to the sixth aspect of the present invention is configured such that between peripheral portions of opposed glass substrates are sealed by the vanadium-based glass material for local heat sealing as set forth in any one of the first to fifth aspects.

The seventh aspect of the present invention is configured such that the glass substrates have a thermal expansion coefficient of $35\times10^{-7}/°$ C. to $50\times10^{-7}/°$ C. in the flat display as set forth in the sixth aspect.

A method for manufacturing the flat display according to the eighth aspect of the present invention includes the steps of placing the vanadium-based glass material for local heat sealing as set forth in any one of the first to fifth aspects between peripheral portions of opposed glass substrates, heating and melting the glass material by irradiation of a laser beam, and sealing between the peripheral portions of the both glass substrates.

According to the first aspect of the present invention, the vanadium-based glass material for local heat sealing contains $V_2O_5$, ZnO, $TeO_2$, $Al_2O_3$, and $Nb_2O_5$ at respective specific ratios as essential components. Therefore, in addition to having the low glass transition point and softening point and being superior in low-temperature workability, the glass material has an extremely low thermal expansion coefficient, good fluidity and stability in melting, and yet has good absorbability of a laser beam, and thus can ensure good display performance by suppressing a thermal shock to an internal functional element such as the organic EL element in the flat display through the use of laser sealing with less heat input amount, and can be produced in high yield without requiring strict management and control of sealing conditions, and achieve high sealability and large sealing strength. In addition, the vanadium-based glass material is extremely excellent in water resistance of sealed portions because of not containing P. Especially when the vanadium-based glass material is used for sealing the organic EL display, high luminescence characteristics of the organic EL element can be ensured for a long period of time. Furthermore, the ratio of extremely expensive $TeO_2$ can be reduced in the vanadium-based glass material, and accordingly, the material costs can be significantly reduced as compared to the conventional vanadium-based glass material. Further, the vanadium-based glass material does not contain Pb, so that there are no toxicity problems.

According to the second aspect of the present invention, the glass material contains not only the above five components of $V_2O_5$, ZnO, $TeO_2$, $Al_2O_3$, and $Nb_2O_5$ but also $Fe_2O_3$ at a specific range as an essential component. Therefore, the strength of the sealing glass is increased and the thermal expansion coefficient of the sealing glass layer also becomes lower, and the long-term reliability of the flat display can be increased.

According to the third aspect of the present invention, the glass material contains not only the above five components of $V_2O_5$, ZnO, $TeO_2$, $Al_2O_3$, and $Nb_2O_5$ but also $MnO_2$ at a specific range as an essential component. Therefore, light absorption characteristics are improved, and laser sealing at low output becomes possible accordingly.

According to the fourth aspect of the present invention, the glass material contains not only the above five components of $V_2O_5$, ZnO, $TeO_2$, $Al_2O_3$, and $Nb_2O_5$ but also CuO at a specific range as an essential component. Therefore, the thermal expansion coefficient of the sealing glass layer becomes much lower and comes closer to that of the glass substrate, which is the object to be sealed. As a result, stress generated in the sealed portions along with a temperature change is relieved, and the long-term reliability of the flat display is improved accordingly.

According to the fifth aspect of the present invention, a specific amount of a filler is mixed with a glass powder of the above-described glass composition. Thus, the thermal expansion coefficient of the sealing glass layer can be reliably brought close to the thermal expansivity of the glass substrate, which is the object to be sealed, to increase the sealability and improve the strength of the sealing glass layer.

According to the sixth aspect of the present invention, the flat display has opposed glass substrates between whose peripheral portions are sealed by the above-described vanadium-based glass material for local heat sealing. Therefore, the flat display is provided in which the functional element such as the organic EL element in the interior is completely cut off from the outside air and the sealed portions have excellent sealing strength and thus good display performance can be stably exhibited for a long period of time.

According to the seventh aspect of the present invention, the flat display having the thermal expansion coefficient of the glass substrate in a specific range has thermal expansivities of the glass substrate and the sealing glass layer easily matched. Thus, the flat display having high sealing quality and far superior durability is provided.

According to the method for manufacturing the flat display in accordance with the eighth aspect of the present invention, the above-described vanadium-based glass material for local heat sealing is placed between peripheral portions of opposed glass substrates, and then the glass material is heated and melted by irradiation of a laser beam to seal between the peripheral portions of the both glass substrates. Therefore, the flat display having good sealing quality and excellent durability can be mass-produced with high efficiency and in high yield without requiring strict management and control of sealing conditions while a thermal shock to the internal functional element such as the organic EL element is suppressed by reducing the heat input amount involved in sealing.

DETAILED DESCRIPTION OF THE INVENTION

A vanadium-based glass material for local heat sealing of the present invention has the following glass composition and substantially does not contain Pb and P.
$V_2O_5$: 30.0 to 60.0 mol %
ZnO: 20.1 to 30.0 mol %
$TeO_2$: 10.0 to 25.0 mol %
$Al_2O_3$: 1.0 to 5.0 mol %
$Nb_2O_5$: 0.5 to 5.0 mol %
BaO: 0 to 10.0 mol %
$Fe_2O_3$: 0 to 5.0 mol %
$MnO_2$: 0 to 5.0 mol %
CuO: 0 to 5.0 mol %
$SiO_2$: 0 to 5.0 mol %
CaO: 0 to 8.0 mol %

That is, this vanadium-based glass material basically consists principally of three components of $V_2O_5$, ZnO, and $TeO_2$ and contains small amounts of $Nb_2O_5$ and $Al_2O_3$ as essential components. However, as compared to the sealing glass material of the $V_2O_5$—ZnO—BaO—$TeO_2$ system according to the earlier filed patent application, the ratios of $TeO_2$ and BaO are generally small (BaO may be 0%) and the ratio of ZnO is high instead. It is general for the conventional vanadium-based glass frit for laser sealing, including the earlier filed patent application, to ensure laser sealability by increasing the content ratios of colored $V_2O_5$ and $TeO_2$. However, particularly Te is a rare metal with very limited reserves and thus is extremely expensive. As a matter of course, the vanadium-based glass frit with the increased ratio of $TeO_2$ also has high material costs. This has been a factor in preventing the spread of the vanadium-based glass frit for use in laser sealing.

However, the vanadium-based glass material of the present invention can obtain excellent laser sealability in combination with other components even if the ratio of $TeO_2$ is reduced to close to 10 mol %, as shown in examples described later. Therefore, the material costs can be significantly reduced more than before. Further, the vanadium-based glass material has a much lower thermal expansion coefficient of the sealing glass layer by setting the total ratio of $TeO_2$ and BaO lower (including no BaO) and increasing the ratio of ZnO as compared to the sealing glass material of the $V_2O_5$—ZnO—BaO—$TeO_2$ system of the earlier filed patent application. As a result, thermal expansivities of the glass substrate and the sealing glass layer are easily matched, wherewith very excellent sealability and large sealing strength can be provided.

Additionally, this vanadium-based glass material substantially does not contain P, so that the sealing glass layer has extremely excellent water resistance. Especially when the vanadium-based glass material is used for sealing the organic EL display, high luminescence characteristics of the organic EL element can be ensured for a long period of time. Further, there are no toxicity problems because of not containing Pb.

If the proportion of $V_2O_5$ is too high in the above glass composition, there is a concern about devitrifying in laser sealing. If the proportion is too small, the low-temperature workability may be reduced and the thermal expansivity of the sealing glass layer may be increased due to a rise in the glass transition point [Tg] and softening point [Tf]. A more preferable ratio of $V_2O_5$ is 30.0 to 50.0 mol %.

If the proportion of ZnO is too small, the thermal expansion coefficient of the sealing glass layer cannot be made sufficiently low. On the contrary, if the proportion is too high, the vitrification may be inhibited and ZnO is unlikely to be melted or likely to remain unmelted.

The proportion of $TeO_2$ is preferably made small from the viewpoint of reducing the material costs as previously described. Since there is a concern about devitrifying in laser sealing if too small, the proportion shall be 10.0 mol % or more. Further, if the proportion is too high, there are problems that not only the material costs may be high but also the thermal expansion coefficient of the sealing glass layer may become high. A more preferable ratio of $TeO_2$ is 10.0 to 22.5 mol %.

As for $Nb_2O_5$ and $Al_2O_3$, the mix within the above-specified ranges significantly improves the low-temperature workability, drastically decreases the thermal expansion coefficient of the sealing glass layer, enhances the glass stability, and increases the water resistance and chemical resistance as well. If respective proportions are too high, the low-temperature workability may be conversely reduced even if the thermal expansion coefficient is further decreased. If the proportions are too small, a sufficient mixing effect cannot be achieved. Particularly $Al_2O_3$ is recommended to be mixed at 2.0 mol % or more.

Furthermore, the vanadium-based glass material for local heat sealing of the present invention can be mixed with a variety of other oxide components if necessary besides the five kinds of essential components of $V_2O_5$, ZnO, $TeO_2$, $Nb_2O_5$, and $Al_2O_3$. Preferred as such given mixed components are six kinds of BaO, $Fe_2O_3$, $MnO_2$, CuO, $SiO_2$, and CaO as shown in the above-described glass composition. Among these, particularly three kinds of $Fe_2O_3$, $MnO_2$, and CuO are of use.

Among the above-described preferred given components, BaO is a component serving as a network modifier oxide together with ZnO and $TeO_2$. If the mixing proportion is too high in the vanadium-based glass material of the present invention, the thermal expansion coefficient of the sealing glass layer may become high. Thus, the mixing proportion shall be 10.0 mol % or less as shown in the above-described glass composition, and more preferably 4.0 mol % or less.

Among the same given components, $Fe_2O_3$ has a large effect of improving the strength of the sealing glass and also has the effect of reducing the thermal expansion coefficient of the sealing glass layer. Thus, it is recommended to mix 1.0 mol % or more. However, a too high proportion may increase the viscosity at the melting stage of the glass and decrease the recovery rate. Thus, the upper limit shall be 5.0 mol %.

Among the same given components, $MnO_2$ has the effect of improving the light absorbability effective for laser sealing by being melted in the glass components, and is useful for laser sealing at low output. Thus, it is recommended to mix 1.0 mol % or more. However, a too high proportion may increase the viscosity at the melting stage of the glass, similar to $Fe_2O_3$. Thus, the upper limit shall be 5.0 mol %.

Among the same given components, CuO and $SiO_2$ have the effect of reducing the thermal expansion coefficient by being additionally mixed with the above-described glass composition. Since particularly CuO has a large reduction effect of the thermal expansion coefficient, it is recommended to mix 1.0 mol % or more. However, too much CuO may facilitate the crystallization and reduce the fluidity in a molten state, and too much $SiO_2$ may inhibit the low-temperature workability. Accordingly, respective upper limits shall be 5.0 mol %.

Among the same given components, CaO has the effect of improving the stability of the sealing glass. However, a too large mixing amount may become a factor in causing a crystallization phenomenon. Thus, the upper limit shall be 8.0 mol %.

In order to manufacture the vanadium-based glass material for local heat sealing of the present invention, a powder mixture of raw material is put into a pot such as a platinum crucible, fired within a heating furnace such as an electric furnace for a predetermined time, melted, and vitrified. This melt is poured into an appropriate form such as an alumina boat and cooled down. A resulting glass block has only to be pulverized into an appropriate particle size by a pulverizer to form a glass frit. It is suitable that the glass frit has a particle size in the range of 0.05 to 100 μm. Coarse particles produced by the above-described pulverization have only to be classified and removed. However, for a glass frit used for a sealant of an ultra-thin display for a small device, the particle size is recommended to be 10 μm or smaller, and more preferably 6 μm or smaller.

In the above pulverization, a variety of pulverizers such as a jet mill conventionally commonly used in glass frit manufacturing can be used. It is advisable to employ wet pulverization to obtain a fine particle size, in particular, 3 μm or smaller. This wet pulverization is to pulverize in an aqueous solvent like a water or alcohol aqueous solution, by using alumina or zirconia media (balls) with a diameter of 5 mm or smaller or using a beads mill. The wet pulverization can pulverize much finer than jet mill grinding but is a fine grinding process using an aqueous solvent. Thus, a glass composition which is an object to be pulverized needs to have high water resistance. The glass material of the present invention is suitable in this respect as well.

In addition to that the glass powder (glass frit) having the above-described glass composition is used alone, the vanadium-based glass material for local heat sealing of the present invention may take a form of a mixture in which a filler such as a filling material or an aggregate is mixed with the glass powder. The mixing of such filler further reduces the thermal expansion coefficient of the sealing glass layer. Thus, the thermal expansivity of the sealing glass layer can be easily matched to that of the glass substrate of the flat display by adjusting the mixing amount of the filler. In the form of the mixture, the glass components serve as a binder which binds filler particles together at the time of heating and melting. Thus, a resulting sealing glass layer becomes a sintered body in a high-strength and compact ceramic form.

The above filler may be any one as long as the filler has a melting point higher than that of the glass components and is not melted at a firing temperature in the processing. The filler is not particularly restricted in kind, but preferred are powders of, such as zirconium phosphate, zirconium silicate, cordierite, β-eucryptite, β-spodumene, zircon, alumina, mullite, silica, β-quartz solid solution, zinc silicate, and aluminium titanate, for example. It is advisable for the mixing amount of the filler to be in the range of ratio by weight of the glass powder to the filler of 50:50 to 99:1. If the mixing amount is too large, the fluidity in melting may be reduced and a binding capacity of the glass composition may become deficient and thus a strong sintered body cannot be formed.

Generally, alkali-free glass is adopted to the glass substrate of the flat display such as the organic EL display or the liquid crystal display. The thermal expansion coefficient of the alkali-free glass is usually about $35 \times 10^{-7}/°$ C. to $50 \times 10^{-7}/°$ C. In the vanadium-based glass material for local heat sealing of the present invention, on the contrary, the thermal expansion coefficient of the glass powder itself is small, and accordingly, the thermal expansion coefficient of the sealing glass layer can be reduced to as much as that of the glass substrate as shown in examples of the filler mixing described later while the fluidity in a molten state is sufficiently secured, through adjustment by the mixing of the filler.

The glass powder (glass frit) of the vanadium-based glass material for local heat sealing of the present invention and the mixed powder in which the above-described filler is mixed with this glass powder are formed into a paste which is dispersed with a high concentration generally in an organic binder solution, and then coating a peripheral portion of at least one of the glass substrates to be arranged opposed to each other of the flat display with the paste by screen printing etc. Thus, the powders may be manufactured in a paste form beforehand.

The organic binder solution used for the above paste has no particular restrictions, and includes for example a solution in which a binder of celluloses such as nitrocellulose or ethyl cellulose is dissolved in a solvent such as butyl carbitol acetate, butyl diglycol acetate, terpineol, pine oil, an aromatic hydrocarbons solvent, a mixed solvent such as a thinner, etc., and a solution in which an acrylic resin binder is dissolved in a solvent of ketones, esters, low-boiling aromatics, etc. The viscosity of the paste is advisably in the range of 30 to 3000 dPa·s in terms of coating workability.

The sealing processing with use of the vanadium-based glass material for local heat sealing of the present invention includes placing the glass material between peripheral portions of glass substrates opposed to each other of a flat display, heating and melting the glass material, and sealing between the peripheral portions of the both glass substrates. At that moment, the glass material could be placed between the both glass substrates in a form of a powder or thin plate. However, a method of coating at least one of the glass substrates with the glass material in the paste form is recommended in order to form an ultra-thin sealing glass layer. Further, the local heating means for melting the glass material is not limited to the laser heating method and includes a heating method by high frequency radiation, etc. However, practically used at present is the laser heating method. Since taking a brown to seal brown which is excellent in absorbability of a laser beam, the powder of the vanadium-based glass material of the present invention possesses excellent laser sealability.

The heat treatment of this sealing processing can be performed at one time. However, the treatment is advisably performed in two steps to improve sealing quality. That is, first as a preliminary firing, vehicle components (the binder and the solvent) of the paste are volatilized, pyrolytically decomposed, and brought into a state where only frit components are left, by heating to near the softening point [Tf] of the glass material. Subsequently as a main firing, a sealing glass layer in which the glass components are completely melted and integrated is formed by local heating with use of laser beam irradiation.

According to such two-step heat treatment, the vehicle components are volatilized and removed at the first step of preliminary firing and the glass components are fused with each other at the second step of main firing. Thus, air bubbles and pin holes due to deairing can be prevented from being formed within the sealing glass layer. As a result, the sealing reliability and the strength of sealed portions can be improved. Particularly in the organic EL display, the organic EL element which is easily thermally degraded is arranged in the interior and the sealed portions are sealed and fixed while electrodes, lead wires, exhaust pipes, etc., are interposed between the sealed portions. Therefore, thermal adverse effects on the organic EL element can be further reduced by performing the first-step heat treatment only on an unassembled glass substrate having been coated with the paste and then using the glass substrate and other necessary members to assemble into a form of a product, and performing the second-step heat treatment in the assembled state.

In the schematic configuration shown in FIG. 1 as already described, the flat display of the present invention, in the case of the organic EL display, is such that the sealing layer 6 is composed of a sealing glass layer using the above-described vanadium-based glass material for local heat sealing of the present invention. The sealing layer 6 has a high airtightness retaining ability as a melted and solidified substance of the glass frit, and also has excellent adhesion and adhered strength with respect to surfaces of the both glass substrates to be arranged opposed to each other, that is, the EL element substrate 1 and the sealing glass plate 5. Thus, the sealing layer 6 provides high sealability and large sealing strength, and additionally exhibits good water resistance and chemical resistance. Consequently, this organic EL display is superior in durability of the sealed portions and can exert good display performance stably over a long period of time. Additionally, there is no need to arrange a water capturing agent or drying agent inside the package. The internal configuration is simplified accordingly, and assembling and production can be performed easily at a low cost. Since moisture is less likely to be adsorbed on the glass material superior in water resistance, steam is not produced as outgas from the glass frit in the sealing processing, and there is also no concern that the steam enters into the package and deteriorates the organic EL element. Such advantages are the same as in other flat displays such as a liquid crystal display.

EXAMPLES

Hereinafter, the present invention is described concretely by using examples. Raw material oxides used in the following were all special grade reagents made by Wako Pure Chemical Industries, Ltd. Likewise, special grade reagents were used for other analytical reagents, etc., as well.

Manufacturing Example 1

A mixture (10 g in total) in which respective powders of $V_2O_5$, $BaO$, $TeO_2$, $Nb_2O_5$, $Al_2O_3$, $ZnO$, $MnO_2$, $CuO$, $Fe_2O_3$, $SiO_2$, $CaO$, and $P_2O_5$ as raw material oxides have been mixed at ratios (mol %) listed in Table 1 and Table 2 as shown below was stored in a platinum crucible, heated within an electric furnace at about 1000° C. for 60 minutes, and melted. After that, the melt was poured into an alumina boat and a glass bar was made. The glass bar was cooled down in the atmosphere and then ground by an automatic mortar. The ground substances were classified and ones having a particle diameter of 100 μm or smaller were collected. Then, powder vanadium-based glass materials No. 1 to 22 were made.

The vanadium-based glass materials No. 1 to 22 having been made by the above-described method were examined for glass transition point [Tg], softening point [Tf], thermal expansion coefficient, fluidity and vitreous luster in a molten state, laser sealability, and color shade. The results are shown in the following Table 1 and Table 2. Measuring methods for respective items are as follows.

[Glass Transition Point and Softening Point]

α-alumina was used as a reference (a standard sample), and the glass transition point [Tg] and softening point [Tf] of the samples were measured by a differential thermal analyzer (under the designation, TG-8120 of Rigaku Corporation) under measuring conditions of a heating rate of 10° C. per minute and a temperature range of 25° C. (room temperature) to 400° C.

[Thermal Expansion Coefficient]

The thermal expansion coefficient was measured by a thermal mechanical analyzer (under the designation, TMA8310 of Rigaku Corporation). This measurement used, as measurement samples, rectangular columns of 5×5×20 mm (length×width×height) an upper surface and a bottom surface thereof are parallel to each other, into which the vanadium-based glass material powders have been melted again and molded. The temperature was increased from room temperature to 250° C. at a rate of 10° C. per minute, and an average thermal expansion coefficient α was obtained. Quartz glass was used as a standard sample.

[Fluidity/Vitreous Luster]

Each vanadium-based glass material was melted and hardened in a mold and made into a button-like molded sample having a diameter of 8.8 mm and a thickness of 2.0 mm. While placed on a glass substrate, the molded sample was heated in an electric furnace at a heating rate of 10° C. per minute to increase the temperature. The sample was maintained for 10 minutes at 420° C., 450° C., and 500° C. respectively, and then cooled down to room temperature. Changes in state of the molded sample were observed and an evaluation was made on a scale of the following four categories.

⊚ . . . Showing good fluidity and vitreous luster at 420° C.
○ . . . Showing good fluidity and vitreous luster at 450° C.
Δ . . . Showing good fluidity and vitreous luster at 500° C.
x . . . Showing not good fluidity and vitreous luster at 500° C. or lower.

[Laser Sealability]

20 g of vehicle composed of ethyl cellulose, butyl carbitol acetate, and terpineol were added and mixed with respective 100 g of the vanadium-based glass materials to prepare frit pastes. One of the surfaces of a rectangular alkali-free glass substrate (having a length of 40 mm, a width of 30 mm, a thickness of 0.7 mm, and a thermal expansion coefficient of $40×10^{-7}$/° C.) was coated with the frit paste in such a manner that the paste draws a 30×20 mm rectangle having a line width of 0.6 mm and a thickness of about 10 μm. The glass substrate was preliminarily fired in an electric furnace at 300° C. for 60 minutes. After that, an alkali-free glass substrate having the same dimension was laid on the frit-coated surface side of the glass substrate while positionally shifted in the longitudinal direction, and then the glass substrates were clipped together and fixed. The glass substrate having been preliminarily fired was faced up, and in a method of irradiating a laser beam of a semiconductor laser (having a wavelength of 808 nm) along the coating line of the frit paste at an irradiation rate of 2 mm per second, the condition of sealing was observed by a technique of increasing the laser output in stages in a range of 7 W to 16 W. An evaluation was made on a scale of the following three categories.

⊚ . . . Coming into a good sealing state at an output of less than 10 W.

○ . . . Coming into a good sealing state at an output of 10 W or more to less than 15 W.

x . . . Sealing was failed even at an output of 15 W or more.

TABLE 1

| | | Vanadium-based glass material No. | | | | | | | | | | |
|---|---|---|---|---|---|---|---|---|---|---|---|---|
| | | 1 | 2 | 3 | 4 | 5 | 6 | 7 | 8 | 9 | 10 | 11 |
| Glass composition (mol %) | $V_2O_5$ | 40.5 | 43.2 | 40.3 | 38.7 | 33.3 | 37.1 | 38.9 | 38.9 | 36.4 | 37.9 | 37.4 |
| | ZnO | 26.3 | 25.6 | 25.7 | 27.3 | 23.7 | 28.9 | 26.9 | 21.0 | 25.0 | 26.6 | 24.1 |
| | $TeO_2$ | 21.6 | 16.4 | 21.2 | 17.5 | 20.8 | 15.1 | 10.9 | 20.8 | 21.9 | 17.8 | 16.2 |
| | $Nb_2O_5$ | 3.0 | 3.7 | 2.5 | 1.4 | 4.0 | 0.9 | 4.1 | 4.0 | 3.6 | 4.0 | 4.0 |
| | $Al_2O_3$ | 4.1 | 4.1 | 2.0 | 4.1 | 2.9 | 4.5 | 3.6 | 2.3 | 3.5 | 2.6 | 2.7 |
| | BaO | 4.60 | 5.1 | 6.9 | 8.1 | 4.6 | 3.6 | 2.6 | 2.0 | — | — | — |
| | $MnO_2$ | — | 2.0 | — | 1.0 | 2.5 | 2.1 | 3.1 | 2.2 | 1.8 | 2.0 | 2.4 |
| | CuO | — | — | — | 1.0 | 2.5 | — | 3.5 | 2.5 | 2.3 | 2.5 | 2.9 |
| | $Fe_2O_3$ | — | — | — | 1.0 | 1.1 | 4.3 | 1.9 | 1.2 | 1.5 | 1.5 | 1.9 |
| | $SiO_2$ | — | — | 1.5 | — | 2.5 | 2.0 | 2.0 | 2.1 | 1.8 | 2.0 | 2.0 |
| | CaO | — | — | — | — | 2.0 | 1.5 | 2.5 | 3.1 | 2.2 | 3.2 | 6.4 |
| Glass transition point Tg (° C.) | | 317 | 305 | 298 | 314 | 324 | 324 | 326 | 317 | 320 | 325 | 334 |
| Softening point Tf (° C.) | | 334 | 315 | 311 | 331 | 341 | 340 | 339 | 328 | 335 | 348 | 356 |
| Thermal expansion coefficient ($\times 10^{-7}$/° C.) | | 90 | 82 | 95 | 85 | 85 | 76 | 74 | 79 | 76 | 77 | 73 |
| Fluidity/vitreous luster | | ⊚ | ⊚ | ○ | ⊚ | ○ | ⊚ | ⊚ | ⊚ | ⊚ | ⊚ | ⊚ |
| Laser sealability | | ○ | ⊚ | ⊚ | ⊚ | ○ | ⊚ | ⊚ | ⊚ | ⊚ | ⊚ | ⊚ |
| Color shade | | Seal brown | Seal brown | Brown | Seal brown | Seal brown | Seal brown | Seal brown | Seal brown | Seal brown | Seal brown | Seal brown |

TABLE 2

| | | Vanadium-based glass material No. | | | | | | | | | | |
|---|---|---|---|---|---|---|---|---|---|---|---|---|
| | | 12 | 13 | 14 | 15 | 16 | 17 | 18 | 19 | 20 | 21 | 22 |
| Glass composition (mol %) | $V_2O_5$ | 45.1 | 30.5 | 19.0 | 31.9 | 42.3 | 25.1 | 37.5 | 42.3 | 37.8 | 38.3 | 36.1 |
| | ZnO | 33.2 | 20.7 | 46.0 | 11.9 | 13.4 | 24.4 | 25.9 | 19.1 | 15.4 | 25.2 | 25.3 |
| | $TeO_2$ | 21.7 | 48.8 | 35.0 | 37.1 | 26.0 | 30.1 | 17.4 | 26.1 | 27.7 | 12.9 | 14.0 |
| | $Nb_2O_5$ | — | — | — | — | 2.0 | 3.9 | 4.4 | 4.0 | 3.5 | 3.2 | 4.6 |
| | $Al_2O_3$ | — | — | — | — | 1.0 | 3.7 | — | 4.1 | 4.1 | 2.7 | 2.4 |
| | BaO | — | — | — | 19.1 | 14.3 | 8.3 | 4.1 | — | 5.0 | — | — |
| | $MnO_2$ | — | — | — | — | — | 2.0 | 4.9 | 2.0 | 2.0 | 2.5 | 2.1 |
| | CuO | — | — | — | — | — | 2.5 | 4.8 | — | 2.5 | 3.3 | 1.8 |
| | $Fe_2O_3$ | — | — | — | — | — | — | — | 1.5 | 2.0 | 2.5 | 2.6 |
| | $SiO_2$ | — | — | — | — | 1.0 | — | 0.5 | — | — | 2.5 | 2.5 |
| | CaO | — | — | — | — | — | — | 0.5 | 0.9 | — | 3.9 | 8.5 |
| Glass transition point Tg (° C.) | | 258 | 295 | 331 | 297 | 285 | 353 | 332 | 326 | 317 | 336 | 320 |
| Softening point Tf (° C.) | | 273 | 321 | 352 | 311 | 300 | 381 | 340 | 341 | 335 | 358 | 353 |
| Thermal expansion coefficient ($\times 10^{-7}$/° C.) | | 125 | 145 | 120 | 143 | 120 | 105 | 95 | 92 | 97 | 71 | 71 |
| Fluidity/vitreous luster | | x | x | x | ⊚ | ⊚ | x | Δ | Δ | ○ | Δ | x |
| Laser sealability | | x | x | x | ○ | ○ | x | ○ | ○ | ○ | ○ | x |
| Color shade | | Dark brown | Dark brown | Dark brown | Dark brown | Seal brown | Seal brown | Seal brown | Seal brown | Seal brown | Seal brown | Seal brown |

From the results shown in Table 1, it is obvious that vanadium-based glass materials (No. 1 to 11) of the present invention having a glass composition in which a basic combination composed of three components of $V_2O_5$, ZnO, and $TeO_2$ at respective proper ratios were additionally mixed with $Nb_2O_5$ and $Al_2O_3$ in a proper range have a low glass transition point [Tg] of less than 335° C. and a low softening point [Tf] of less than 360° C. and show good fluidity and vitreous luster at a low temperature of 450° C. or lower and accordingly allow laser sealing at low output besides being superior in low-temperature workability. It is also obvious that the vanadium-based glass materials have a low thermal expansion coefficient of the glass of $95 \times 10^{-7}/°$ C. or lower and possess high suitability for use in laser sealing of the organic EL display. It is understood that particularly the vanadium-based glass materials (No. 7 to 11) containing 1.0 mol % or more of $MnO_2$, CuO, and $Fe_2O_3$ respectively and 4.0 mol % or less of BaO are very excellent in low-temperature workability and laser sealability and also have an extremely low thermal expansion coefficient of less than $80 \times 10^{-7}/°$ C. and are the most suitable for use in laser sealing of the organic EL display.

On the other hand, as understood from the results shown in Table 2, glass materials (No. 12 to 14) composed of three components of $V_2O_5$, ZnO, and $TeO_2$ have difficulty in laser sealing besides being poor in low-temperature workability. A glass material (No. 15) mixed with excessive BaO in addition to the above-described three components and a glass material (No. 16) mixed with excessive BaO and proper amounts of $Nb_2O_5$ and $Al_2O_3$ in addition to the above-described three components are excellent in low-temperature workability and allow laser sealing but have a large thermal expansion coefficient. Therefore, reducing a difference in thermal expansivity with the glass substrate composed of general alkali-free glass, which is an object to be sealed, is difficult and the long-term reliability of sealed portions cannot be ensured. Even if having a glass composition in which the basic combination composed of three components of $V_2O_5$, ZnO, and $TeO_2$ were added with $Nb_2O_5$, $Al_2O_3$, BaO, $MnO_2$, and CuO in a proper range, a glass material (No. 17) having a too low ratio of $V_2O_5$ is poor in low-temperature workability and has difficulty in laser sealing. Glass materials (No. 13 to 17) having a large mixing amount of $TeO_2$ have a problem that the material costs are very high as already described in addition to the above drawbacks.

Further, from the results shown in Table 2, a glass material (No. 18) different from the glass composition of the present invention in that $Al_2O_3$ was not contained and a glass material (No. 19) having a too small proportion of ZnO with respect to the glass composition of the present invention have insufficient low-temperature workability. In a glass material (No. 20) added with BaO covering for a small proportion of ZnO with respect to the glass composition of the present invention, the low-temperature workability is improved but the thermal expansion coefficient is increased. In addition, in a glass material (No. 21) having an excessive mixing amount of $Nb_2O_5$ with respect to the glass composition of the present invention, the thermal expansion coefficient is greatly reduced but the low-temperature workability goes down. A glass material (No. 22) having an excessive mixing amount of CaO caused crystallization.

Manufacturing Example 2

Zirconium phosphate (having the largest particular diameter of 5.5 μm and an average particular diameter of about 1.0 μm) was mixed as a filler with powders of the vanadium-based glass materials No. 7 and No. 16 in the above Manufacturing Example 1 at ratios shown in the following Table 3, and then filler-containing glass materials No. F1 to F4 were made. The filler-containing glass materials No. F1 to F4 were examined for thermal expansion coefficient, laser sealability, sealing strength, and color shade, and the results are shown in Table 3. Measuring methods and evaluations of the thermal expansion coefficient, laser sealability, and color shade are the same as those of the Manufacturing Example 1. A measurement of the sealing strength is as follows.

[Sealing Strength Test]

20 g of vehicle composed of ethyl cellulose, butyl carbitol acetate, and terpineol were added and mixed with respective 100 g of the filler-containing glass materials No. F1 to F4 having been obtained in the above Manufacturing Example 2, and each frit paste was prepared. One of the surfaces of a rectangular alkali-free glass substrate (having a length of 40 mm, a width of 30 mm, a thickness of 0.7 mm, and a thermal expansion coefficient of $40 \times 10^{-7}/°$ C.) was coated with the frit paste in such a manner that the paste draws a 30×20 mm rectangle having a line width of 0.6 mm and a thickness of about 10 μm. The glass substrate was preliminarily fired in an electric furnace at 300° C. for 60 minutes. After that, an alkali-free glass substrate having the same dimension was laid on the frit-coated surface side of the glass substrate while positionally shifted in the longitudinal direction, and then the glass substrates were clipped together and fixed. The glass substrate having been preliminarily fired was faced up, and a laser beam of a semiconductor laser (having a wavelength of 808 nm) was irradiated along the coating line of the frit paste at an irradiation rate of 2 mm per second. In this way, the glass components of the frit were melted and the sealing was performed. This sealed pair of glass substrates was fixed vertically, and a downward pressure was applied at a rate of 1000 N per minute or smaller to an upper end of the glass substrate having been placed at the top by the above positional shift. The sealing ability (compression shear strength) per unit area was calculated from the peak pressure at the time when the sealed surface was peeled off. The sealing ability is shown as sealing strength in Table 3.

TABLE 3

| | | Filler-containing glass material No. | | | |
| --- | --- | --- | --- | --- | --- |
| | | F1 | F2 | F3 | F4 |
| Mixing ratio (% by weight) | Vanadium-based glass material No. 7 | 80 | 70 | 60 | — |
| | Vanadium-based glass material No. 16 | — | — | — | 70 |
| | Zirconium phosphate | 20 | 30 | 40 | 30 |
| Thermal expansion coefficient ($\times 10^{-7}/°$ C.) | | 55.2 | 48.3 | 38.2 | 72.0 |
| Laser sealability | | ◎ | ◎ | ○ | ○ |
| Sealing strength (kf/mm$^2$) | | 1.23 | 1.18 | 1.09 | 0.845 |
| Color shade | | Seal brown | Seal brown | Dark brown | Brown |

As shown in Table 3, the filler-containing glass materials No. F1 to F3 using the vanadium-based glass material No. 7 according to the present invention have a thermal expansion coefficient closer to that of the alkali-free glass which is a general glass substrate of the flat display, and has a larger sealing strength as compared to the filler-containing glass material No. F4 of a comparative example. Therefore, it is understood that the filler-containing glass materials No. F1 to F3 can obtain high sealability accordingly and are excellent in long-term reliability of sealed portions.

[Water Resistance Test]

The vanadium-based glass materials No. 2, 3, 7, 15, and 16 having been obtained in the above Manufacturing Example 1 and the glass material No. 23 in which 5 mol % of $P_2O_5$ was additionally mixed with the glass composition of the glass material No. 3 were melted and hardened within molds, and rectangular column-shaped samples of about 1 g (having a length of about 6.3 mm) were made. The rectangular column-shaped samples were respectively soaked into 500 mL water. Each container was put into a constant-temperature bath at about 90° C., and the sample was taken out after 48 hours and subjected to drying at 100° C. for 1 hour. The weight of the sample having been naturally cooled was measured, and a weight reduction rate from the initial weight was calculated by the following equation. The results and evaluations are shown in Table 4.

Weight reduction rate (%)=[1−measured weight (g)/ initial weight (g)]×100

TABLE 4

|  | Vanadium-based glass material No. | | | | | |
| --- | --- | --- | --- | --- | --- | --- |
|  | 2 | 3 | 7 | 15 | 16 | 23 |
| Initial weight (g) | 0.9813 | 1.1981 | 1.3216 | 1.2361 | 1.0413 | 1.0619 |
| Weight after 48 hours (g) | 0.9805 | 1.1969 | 1.3207 | 1.2352 | 1.0403 | 1.0547 |
| Reduction rate (%) | 0.082 | 0.100 | 0.068 | 0.073 | 0.096 | 0.678 |
| Evaluation | Excellent | Good | Excellent | Excellent | Good | Poor |

As shown in Table 4, the water resistance of the vanadium-based glass materials No. 2, 3, and 7 according to the present invention is excellent since weight reductions after 48 hours are 0.1% or less, and 0.082% and 0.068% particularly in the glass materials No. 2 and 7, and is comparable to the glass materials No. 15 and 16 having a composition in which ZnO was reduced and BaO was increased with respect to the glass composition of the present invention. On the other hand, the glass material No. 23 in which 5.0 mol % of $P_2O_5$ was added to the composition of the glass material No. 3 has significantly reduced water resistance.

What is claimed is:

1. A vanadium-based glass material for local heat sealing, the material comprising: a glass composition containing, in terms of mol %, 30.0 to 60.0% $V_2O_5$, 20.1 to 30.0% ZnO, 10.0 to 25.0% $TeO_2$, 1.0 to 5.0% $Al_2O_3$, 0.5 to 5.0% $Nb_2O_5$, 0 to 10.0% BaO, 1.0 to 5.0% $Fe_2O_3$, 1.0 to 5.0% $MnO_2$, 0 to 5.0% CuO, 0 to 5.0% $SiO_2$, and 0 to 8.0% CaO, and substantially not containing Pb and P.

2. The vanadium-based glass material for local heat sealing according to claim 1, wherein CuO in the glass composition is 1.0 to 5.0 mol %.

3. The vanadium-based glass material for local heat sealing according to claim 1, wherein a glass powder having the glass composition is mixed with a filler in a range of ratio by weight of the glass powder to the filler of 50:50 to 99:1.

4. A flat display having opposed glass substrates between whose peripheral portions are sealed by the vanadium-based glass material for local heat sealing according to claim 1.

5. The flat display according to claim 4, wherein the glass substrates have a thermal expansion coefficient of $35 \times 10^{-7}$/° C. to $50 \times 10^{-7}$/° C.

6. A method for manufacturing a flat display comprising the steps of placing the vanadium-based glass material for local heat sealing according to claim 1 between peripheral portions of opposed glass substrates; heating and melting the glass material by irradiation of a laser beam; and sealing between the peripheral portions of the both glass substrates.

* * * * *